(12) United States Patent
Hsing

(10) Patent No.: US 6,680,515 B1  
(45) Date of Patent: Jan. 20, 2004

(54) LATERAL HIGH VOLTAGE TRANSISTOR HAVING SPIRAL FIELD PLATE AND GRADED CONCENTRATION DOPING

(75) Inventor: Michael Ren Hsing, Saratoga, CA (US)

(73) Assignee: Monolithic Power Systems, Inc., Los Gatos, CA (US)

( * ) Notice: Subject to any disclaimer, the term of this patent is extended or adjusted under 35 U.S.C. 154(b) by 0 days.

(21) Appl. No.: 09/710,101

(22) Filed: Nov. 10, 2000

(51) Int. Cl.⁷ .............................................. H01L 29/76
(52) U.S. Cl. .................. 257/409; 257/138; 257/139; 257/140; 257/336; 257/488; 257/489; 257/491
(58) Field of Search ................. 257/489, 491, 257/409, 488, 336, 138, 139, 140; 357/23.4, 23.3

(56) References Cited

U.S. PATENT DOCUMENTS

| | | | |
|---|---|---|---|
| 5,237,193 A | * | 8/1993 | Williams et al. ............ 257/336 |
| 5,317,171 A | * | 5/1994 | Shekar et al. ............... 257/138 |
| 5,382,826 A | * | 1/1995 | Mojaradi et al. ........... 257/489 |
| 5,498,899 A | * | 3/1996 | Palara ......................... 257/536 |
| 6,153,916 A | * | 11/2000 | Roth et al. .................. 257/409 |

OTHER PUBLICATIONS

Hamza Yilmaz, Optimization and Surface Charge Sensitivity of High–Voltage Blocking Structures with Shallow Junctions, Jul. 1999, IEEE Transactions on Electron Devices, vol. 38, No. 7.*
J.A. Appels, Thin Layer High Voltage Devices, 1980, Philips J. Res. 35, 1–13.*
Yamaguchi, Process and Device Design of a 1000–Volt MOS IC,1981, IEDM 81, 255–258.*

* cited by examiner

Primary Examiner—Richard Elms
Assistant Examiner—Douglas M Menz
(74) Attorney, Agent, or Firm—Perkins Coie LLP

(57) ABSTRACT

A lateral high voltage transistor device is disclosed. The transistor includes a gate, a drain, and a source. The drain is located apart from the gate to form an intermediate drift region. The drift region has variable dopant concentration between the drain and the gate. In addition, a spiral resistor is placed over the drift region and is connected to the drain and either the gate or the source of the transistor.

14 Claims, 2 Drawing Sheets

LATERAL HIGH VOLTAGE TRANSISTOR HAVING SPIRAL FIELD PLATE AND GRADED CONCENTRATION DOPING

FIELD OF THE INVENTION

The present invention relates to high voltage transistors, and more particularly, to a transistor having low on-resistance using a spiral field plate and graded concentration doping in the drift region.

BACKGROUND OF THE INVENTION

Integrated high voltage transistors have found great application in power and switching devices. The most common high voltage transistor is the N-channel lateral MOSFET using reduced surface field (RESURF). In this device, the dopant concentration in the drift region is optimized at $1 \times 10^{12}/cm^2$. See, e.g., "High Voltage Thin Layer Devices (RESURF Devices)," Appels and Vaes, Philips Research Laboratories, IEDM 1979. However, this device has an on-resistance that is very much limited by the breakdown voltage.

Improvement may be obtained by optimizing the dopant concentration throughout the drift region. For example, instead of maintaining a constant doping throughout the drift region, a two-zone structure may be used. This was demonstrated by Yamaguchi et al. as detailed in "Process and Design of a 1000 volt MOS IC," IEDM 1981, Yamaguchi and Morimoto. This structure can obtain a slightly higher average concentration of dopant so that the overall drift region resistance is slightly lower. Lowering the concentration in the drift region near the channel can prevent punch-through of the channel by allowing the depletion region to expand more into the more lightly doped drift region. This results in lower on-resistance because the drift region near the drain contact may be more heavily doped.

A second disadvantage of the RESURF lateral transistor is that high current density operation induces low breakdown voltage. See "Kirk Effect Limitations in High Voltage ICs," ISPSD 1994. During high voltage switching transients, high current densities can occur in the drift region. High current density causes distortion of the field potential due to an excess of majority carriers injected from the source into the drift region. The majority carriers injected from the source disturb the space charge equilibrium established in the off state. This causes the space charge width (depletion width) to decrease. With the high potential difference across a narrowing distance, the electric field must increase. If the injected current density is sufficiently high, the distortion of the space charge region can cause the electric field to exceed the critical field in silicon and breakdown will occur.

Yet another disadvantage of the RESURF device is its long-term reliability. See, for example, "Optimization and Surface Charge Sensitivity of High Voltage Blocking Structure with Shallow Junctions," IEEE Transactions on Electronic Devices, Vol. 38, No. 7, July 1991. Since the drift region surface is exposed to the mobile ions in the interlayer dielectric, the surface potential can change drastically due to dielectric film variations and the application of long-term high voltage bias. When the surface electrical field is distorted, the breakdown voltage may change.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a high voltage transistor that includes a spiral resistor placed atop of a thin oxide layer above a semiconductor substrate. A first end of the spiral resistor is tied to the highest potential of the transistor and the second end is tied to the lowest potential in the transistor. Additionally, the doping concentration in the drift region underneath the spiral transistor is graded.

The transistor of the present invention uses a high-value resistor which spirals across the entire drift region. One end of the resistor is connected to the drain of the transistor and the other end is connected to the source of the transistor. A small current in the resistor actively sets the entire surface potential of the drift region. Because the spiral resistor controls the potential gradient at the surface, the doping concentration in the drift region may be significantly increased so that the on-resistance of the transistor is lower.

However, increasing the concentration uniformly in the drift region causes the depletion region to expand toward the source. As a result, the device experiences punch-through in the body region prematurely. In other words, if the doping concentration in the drift region is uniform, then the reduction in on-resistance of the drift region is limited by the maximum doping concentration that permits the desired punch-through voltage in the body region. In order to further reduce the drift region on-resistance, it is necessary to vary the doping concentration in the drift region versus distance from the body. Therefore, the present invention implements a graded drift region which may be implemented in two, three, or any number of multiple zones.

Because the drift region dose is lighter near the source of the transistor, the depletion region expands into the drift region instead of into the body region. For a very high voltage transistor (for example, capable of handling 1000 volts), a shallow gradient should be used to avoid the punch-through, and for a medium voltage application (approximately 700 volts), a sharp gradient may be used.

Figure 1:
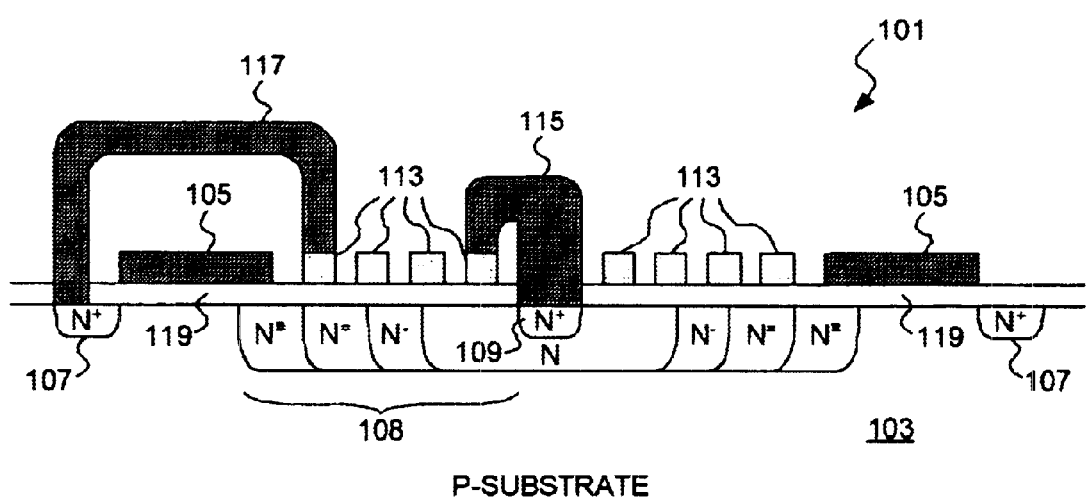
FIG. 1 is a cross-sectional view of a high voltage transistor formed in accordance with the present invention.
Figure 2:
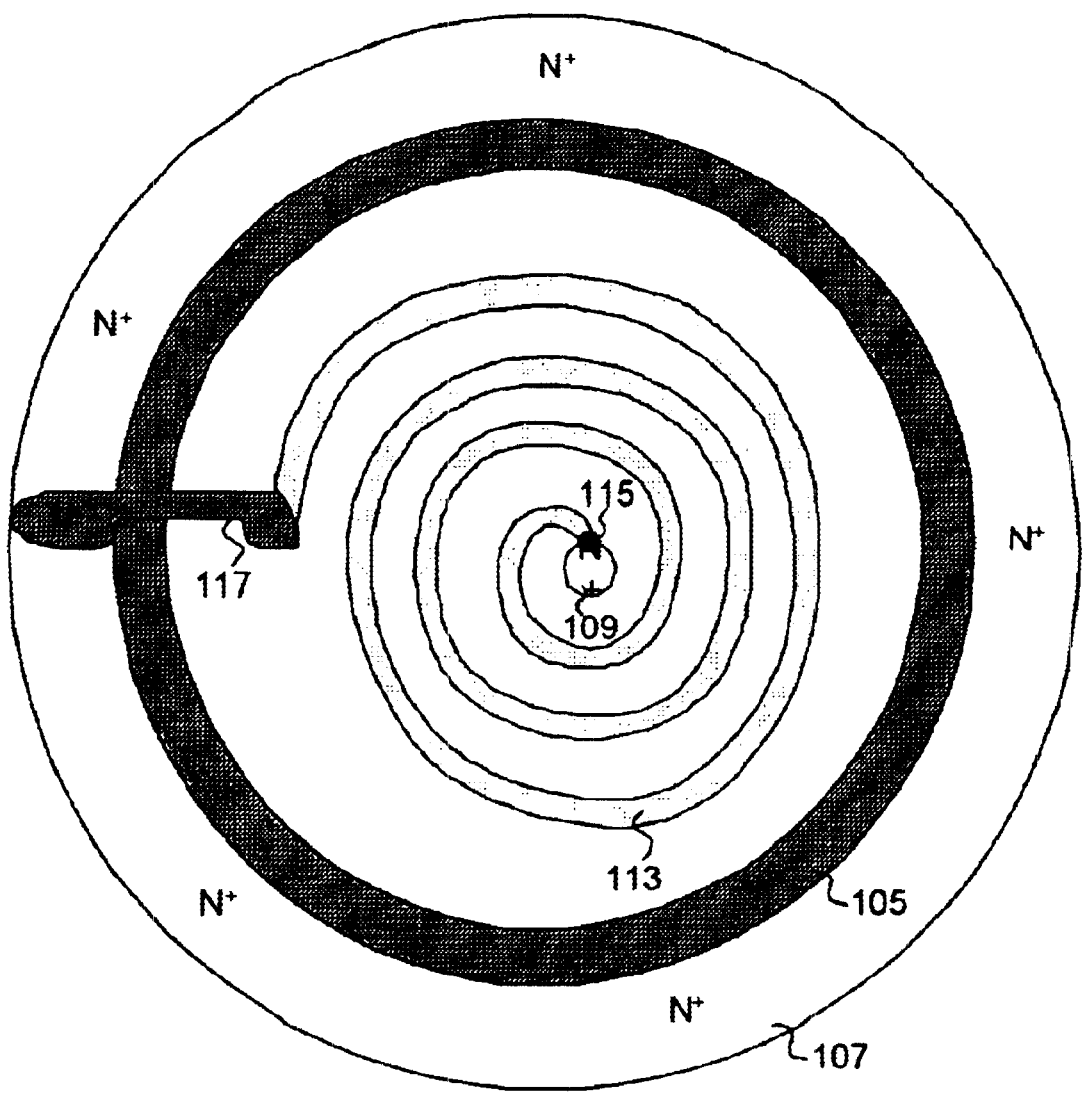
FIG. 2 is a top view of the high voltage transistor of FIG. 1

Turning to FIGS. 1 and 2, a cross-sectional view of a semiconductor substrate having a high voltage transistor formed in accordance with the present invention is shown. The transistor 101 is formed on a p-substrate 103. The p-substrate 103 may be, for example, a p-type epitaxial layer formed on an n-type substrate. The transistor 101 includes a circular gate 105, a source 107 formed adjacent the gate 105, and a drain 109. The drain 109 is separated from the gate 105 by a drift region 111. The drift region 111 is a multi-zone variably doped drift region.

A high resistance spiral resistor 113 is formed above the drift region 101, thereby spiraling between the drain 109 and the gate 105. A first end of the spiral resistor 113 is connected to the drain using an interconnect 115. The other end of the spiral resistor 113 is connected to the source 107 using an interconnect 117. In an alternative embodiment, the second end of the resistor 113 is connected to the gate 105.

Furthermore, a thin gate oxide layer 119 is provided underneath the gate 105 and the spiral resistor 113. The gate oxide separates the drift region 111 and the p-substrate 103 from the gate 105 and the spiral resistor 113.

Preferably, the drift region 111 includes multiple discrete zones, each zone having a different dopant level. Whereas the drain is doped to an n+ level, the first zone immediately surrounding the drain is doped with n-type impurities, for example, at $4 \times 10^{12}$ dopant concentration. The second dopant zone is doped at an n– level, which typically is $3 \times 10^{12}$ dopant concentration. Moving still further away from the drain, the third zone is doped at an n--- level, which is typically $2 \times 10^{12}$ dopant concentration. Finally, the last zone is very lightly n doped to an n--- level, which is typically $1 \times 10^{12}$ dopant concentration.

Although in the preferred embodiment, four discrete doping zones are shown, the present invention may include as little as two dopant zones or many more gradations of doping zones. As can be appreciated by those of ordinary skill in the art, the greater the number of dopant zones, the greater numbers of mask or masks must be used in order to implement the doping. For example, for each dopant zone, a separate mask is necessary for the ion implantation.

Additionally, in the preferred embodiment, the depth of the drift region 111 is on the order of between 4 to 5 microns from the gate oxide layer 119. Further, the distance between the gate 105 and the drain 109 is on the order of between 50 and 150 microns, and more preferably about 80 microns.

Furthermore, the dopant concentration in the drift region 111 can be further increased (thereby decreasing on-resistance) by increasing the dopant concentration in the substrate 103 beneath the drift region 111, while maintaining the dopant concentration constant in those areas of the substrate 103 not underneath the drift region 111. In other words, the drift region 111 (if n-type) would be formed in a more highly doped p-well formed within the substrate 103. By increasing the doping under the drift region 111, this results in a higher pinch effect toward the drain side. Therefore, the drift region concentration can be increased without reducing the breakdown voltage.

The spiral resistor 113 may be implemented by one of any conventional methods. For example, the spiral resistor 113 may be a medium to high resistivity ribbon of polysilicon. With respect to the drift region 111, the low dopant concentration region should be nearest the low voltage electrode and the high dopant concentration zone should be nearest the high voltage electrode. In this particular case, the drain is the high voltage electrode and is closest to the highest doped zone.

It has been found that the transistor 101 of the present invention can actively control the surface potential. This results in the minimization of mobile ion migration effect. Therefore, the reliability of the transistor 101 is improved. Furthermore, the total drift region dopant concentration can be significantly increased without lowering the breakdown voltage. This results in the on-resistance of the transistor 101 being significantly reduced.

Moreover, the electric field during switch transients has little affect. This results in the ability to handle greater amounts of current. Finally, because of the drift region being graded in dopant concentration, low voltage punch-through is eliminated.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A high voltage transistor formed on a semiconductor substrate, the transistor comprising:
   a thin gate oxide layer formed over said substrate;
   a gate formed atop said gate oxide layer;
   a drain formed in said substrate and separated from said gate by a drift region;
   a source formed in said substrate adjacent to said gate;
   a spiral resistor formed atop said gate oxide layer, said spiral resistor located between said drain and said gate, wherein a first end of said spiral resistor is connected to said drain and a second end of said spiral resistor is connected to said source; and
   wherein said drift region is located in said substrate underneath said spiral resistor and includes at least two dopant zones, each of said dopant zones having different dopant concentrations, further wherein said drift region only includes one type of dopant.

2. The transistor of claim 1 wherein said drift region has the lower doped dopant zone closest to said gate and the higher doped dopant zone closest to said drain.

3. The transistor of claim 1 wherein the lower doped dopant zone has a dopant concentration of about $1 \times 10^{12}$ and said higher doped dopant zone has a dopant concentration of $4 \times 10^{12}$.

4. The transistor of claim 1 wherein said drift region includes at least three dopant zones, wherein the lowest doped dopant zone is closest to said gate and the highest doped dopant zone is closest to said drain.

5. The transistor of claim 1 wherein all of said dopant zones extend approximately 4 to 5 microns into said substrate.

6. The transistor of claim 1 wherein said drift region is approximately 80 microns in distance.

7. The transistor of claim 1 wherein the substrate has a first conductivity type and said drift region has a second conductivity type, further wherein a portion of said substrate underneath said drift region has a higher dopant concentration than other portions of said substrate.

8. A high voltage transistor formed on a semiconductor substrate, the transistor comprising:
   a thin gate oxide layer formed over said substrate;
   a gate formed atop said gate oxide layer;
   a drain formed in said substrate and separated from said gate by a drift region;
   a source formed in said substrate adjacent to said gate;
   a spiral resistor formed atop said gate oxide layer, said spiral resistor located between said drain and said gate, wherein a first end of said spiral resistor is connected to said drain and a second end of said spiral resistor is connected to said gate; and
   wherein said drift region is located in said substrate underneath said spiral resistor and includes at least two dopant zones, each of said dopant zones having different dopant concentrations, further wherein said drift region only includes one type of dopant.

9. The transistor of claim 8 wherein said drift region has the lower doped dopant zone closest to said gate and the higher doped dopant zone closest to said drain.

10. The transistor of claim 8 wherein the lower doped dopant zone has a dopant concentration of about $1 \times 10^{12}$ and said higher doped dopant zone has a dopant concentration of $4 \times 10^{12}$.

11. The transistor of claim 8 wherein said drift region includes at least three dopant zones, wherein the lowest doped dopant zone is closest to said gate and the highest doped dopant zone is closest to said drain.

12. The transistor of claim 8 wherein all of said dopant zones extend approximately 4 to 5 microns into said substrate.

13. The transistor of claim 8 wherein said drift region is approximately 80 microns in distance.

14. The transistor of claim 1 wherein the substrate has a first conductivity type and said drift region has a second conductivity type, further wherein a portion of said substrate underneath said drift region has a higher dopant concentration than other portions of said substrate.

* * * * *